(12) United States Patent
Tran

(10) Patent No.: US 7,402,182 B2
(45) Date of Patent: Jul. 22, 2008

(54) HIGH-POWER LGA SOCKET

(75) Inventor: Donald T. Tran, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 390 days.

(21) Appl. No.: 11/085,289

(22) Filed: Mar. 21, 2005

(65) Prior Publication Data

US 2005/0164529 A1  Jul. 28, 2005

Related U.S. Application Data

(62) Division of application No. 10/159,084, filed on May 29, 2002, now Pat. No. 6,870,251.

(51) Int. Cl.
*H01L 21/00* (2006.01)

(52) U.S. Cl. ............... 29/25.01; 438/117; 438/466

(58) Field of Classification Search ............... None
See application file for complete search history.

(56) References Cited

U.S. PATENT DOCUMENTS

| 4,551,747 | A |   | 11/1985 | Gilbert et al. |     |
|-----------|---|---|---------|----------------|-----|
| 4,788,404 | A |   | 11/1988 | Kent           |     |
| 5,058,265 | A |   | 10/1991 | Goldfarb       |     |
| 5,306,948 | A |   | 4/1994  | Yamada et al.  |     |
| 5,637,916 | A | * | 6/1997  | Joshi ............ | 257/668 |
| 5,646,447 | A | * | 7/1997  | Ramsey et al. ...... | 257/727 |
| 5,731,709 | A |   | 3/1998  | Pastore et al. |     |
| 5,765,280 | A |   | 6/1998  | Joshi          |     |
| 5,864,092 | A |   | 1/1999  | Gore et al.    |     |
| 5,892,275 | A |   | 4/1999  | McMahon        |     |
| 5,917,709 | A |   | 6/1999  | Johnson et al. |     |
| 6,040,625 | A |   | 3/2000  | Ip             |     |
| 6,043,558 | A |   | 3/2000  | Manning        |     |
| 6,054,757 | A |   | 4/2000  | Kobayashi      |     |
| 6,057,600 | A |   | 5/2000  | Kitazawa et al.|     |
| 6,105,226 | A |   | 8/2000  | Gore et al.    |     |
| 6,113,399 | A | * | 9/2000  | Hundt et al. ......... | 439/70 |
| 6,368,137 | B1|   | 4/2002  | Orwoll         |     |
| 6,617,946 | B2|   | 9/2003  | Kennedy et al. |     |

(Continued)

FOREIGN PATENT DOCUMENTS

EP  0862213  9/1998

(Continued)

*Primary Examiner*—David E Graybill
(74) *Attorney, Agent, or Firm*—Schwegman, Lundberg & Woessner, P.A.

(57) ABSTRACT

A system for providing electrical contacts between a die and an electrical device includes a die and a package. The package includes a first major surface, a second major surface, a first scalloped edge, a second scalloped edge and a solid end adapted for insertion into a slot. The solid end and the scalloped edges carry current greater than the current needed for an input/output signal. The socket includes a base having an opening therein adapted to receive the package. A slot is located at one end of the opening in the base. The slot is provided with a plurality of conductors for carrying currents greater than the current needed for an input/output signal. A first edge and second edge of the opening include a plurality of spaced overhangs positioned over the opening. The overhangs are sloped with respect to the major planar surface.

5 Claims, 4 Drawing Sheets

U.S. PATENT DOCUMENTS

| | | |
|---|---|---|
| 6,624,645 B2 * | 9/2003 | Haseyama et al. .......... 324/754 |
| 6,624,647 B2 | 9/2003 | Adams et al. |
| 6,870,251 B2 | 3/2005 | Tran |
| 2001/0032740 A1 | 10/2001 | Kennedy et al. |
| 2001/0040287 A1 | 11/2001 | Hosomi |
| 2003/0006792 A1 | 1/2003 | Adams et al. |
| 2005/0164529 A1 * | 7/2005 | Tran ............................ 439/71 |

FOREIGN PATENT DOCUMENTS

| | | |
|---|---|---|
| JP | 2003-318301 | 11/2003 |
| WO | WO-89/00346 A1 | 1/1989 |

* cited by examiner

HIGH-POWER LGA SOCKET

RELATED APPLICATION(S)

This application is a divisional of U.S. application Ser. No. 10/159,084, filed on May 29, 2002, now U.S. Pat. No. 6,870,251 which is incorporated herein by reference.

FIELD OF THE INVENTION

The present invention relates to a package for a semiconductor device, and specifically to a package for semiconductor devices that use a land grid array.

BACKGROUND OF THE INVENTION

As more and more capability is being designed into semiconductor devices, such as memory modules and microprocessors, there are an increasing number of leads or input/output elements being placed onto electronics packages. In the past, peripherally leaded packages provided an adequate number of leads or input/output elements. Peripherally leaded packages have leads or input/output elements along the edges of the electronic component. In many applications, such packages provide an adequate number of input/output elements. In the past few years, however, many semiconductor devices have required more input/output elements than provided in a peripherally leaded package.

To provide additional electrical contacts for a semiconductor device, many have used a grid array package. In a grid array package the input/output elements are placed on the surface of the semiconductor devices. The grid array packages have many advantages, including simplicity, high contact density, and extremely low inductance due to the short paths between the contact and the element within the semiconductor device. There are several types of grid arrays. Ball grid arrays and chip scale packages have hemispherical solder balls as input/output elements. Pin grid arrays have gold plated pins as input/output elements. Land grid arrays have flat, gold plated pads as input/output elements.

In general, the grid array packages are lower cost solutions than the peripherally leaded packages. Of the grid array packages, the most simple and least costly is the land grid array package. Most of the grid array packages have been successfully implemented in products. However, the land grid array packages have technical limitations that stand in the way of wide acceptance of this technology in a useable product. The technical limitations include the fact that land grid array packages have limited current carrying capability. Currently, the lands of the land grid array are used either to carry input/output signals or to carry power. Simply put, the capability of the individual lands to carry power is limited due to the small size of the land grid array and the electrical connections made to the land grid array. This limits the amount of power that can be input to such packages.

Another technical problem with land grid array packages is that there is a short wiping distance between the land and the contact as the contact is initially placed in contact with the land. The wiping distance is the length of travel between an individual land or pad of the land grid array and the contact which is placed in electrical communication with the pad. Generally, longer wiping distances are preferred since the longer wiping distance tends to insure penetration of any oxide layer on the individual land or pad, so that a good electrical contact is made.

There is a growing demand for high loads and evenly distributed loads on a die package. Current land grid array packages have difficulty in handling a high load and difficulty in distributing the load on the packages evenly. This lacking is yet another technical hurdle that stands in the way of acceptance of land grid arrays becoming a widely used packaging technique in various products.

Thus, there is a need for a land grid array packaging method and apparatus that allows the simple, high contact density, low inductance land grid array solution to become widely used. There is a need to overcome the limited current carrying capability of the land grid array package. There is a further need to lengthen the typical short wiping distance to assure reliably good electrical contact between the contacts and the individual lands. There is also a need to meet the demand for high and evenly distributed die loads.

BRIEF DESCRIPTION OF THE DRAWINGS

The invention is pointed out with particularity in the appended claims. However, a more complete understanding of the present invention may be derived by referring to the detailed description when considered in connection with the figures, wherein like reference numbers refer to similar items throughout the figures, and:

The description set out herein illustrates the various embodiments of the invention and such description is not intended to be construed as limiting in any manner.

DETAILED DESCRIPTION

Figure 1:
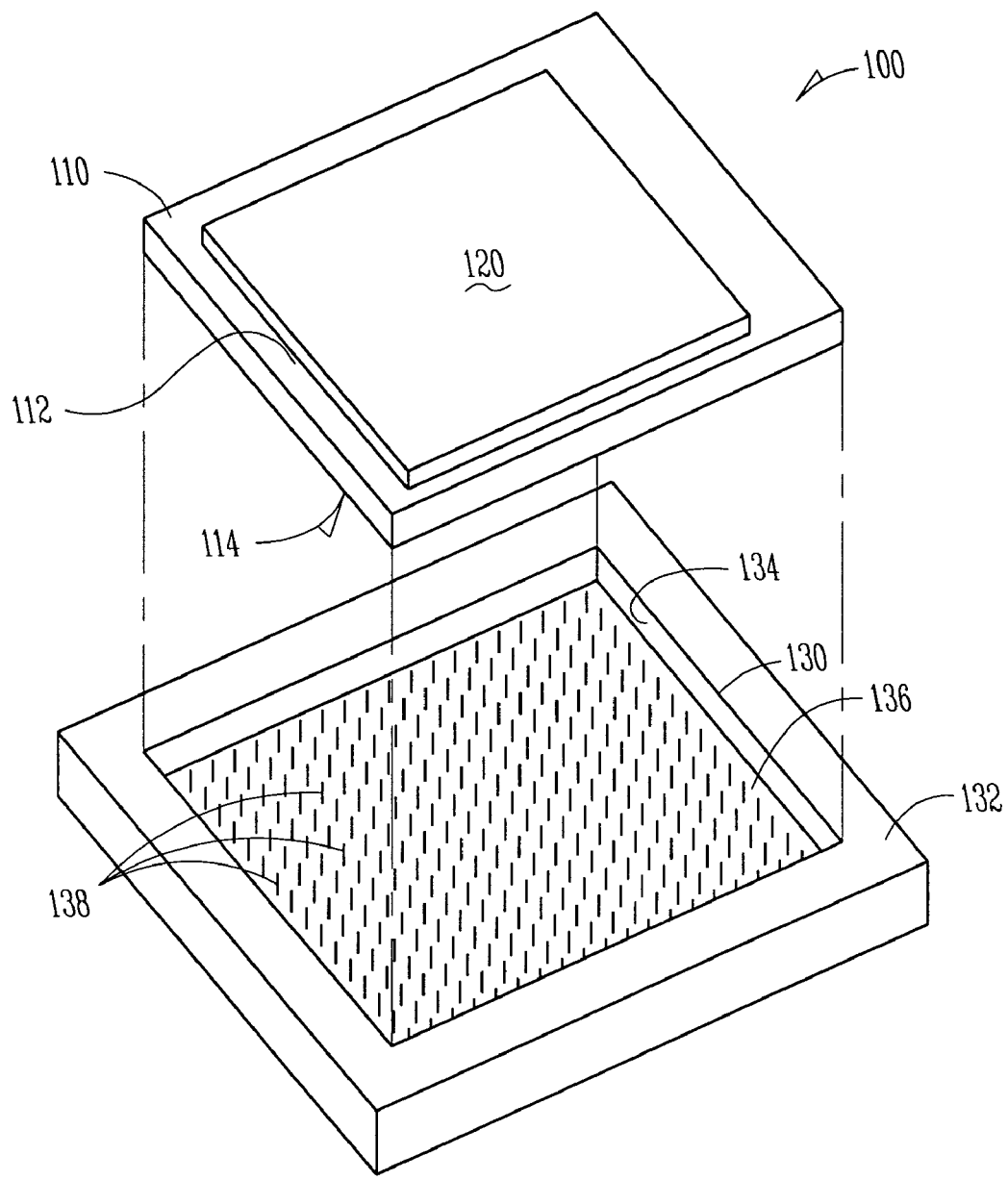
FIG. 1 illustrates a perspective view of a prior art land grid array package.

FIG. 1 illustrates a perspective top view of a prior art land grid array type package 100. The land grid array package includes a substrate 110 to which a die 120 is attached. The substrate includes a first major surface 112 and a second major surface 114. The die 120 is attached to the first major surface 112 of the substrate 110. Located on the second major surface 114 of the substrate 110 is an array of lands. The lands carry both input/output signals to and from the electronics located within the die 120, as well as the current for power as required by the electronics within the die 120. Thus, the land grid array type package 100 of the prior art has the land carrying both the currents necessary for power, as well as the signal level currents for input and output to the electronics within the die 120. The die 120 fits within a corresponding socket 130 that includes a base 132 having an opening 134 therein. At the bottom of the opening 134 is a major surface 136, which includes a plurality of electrical contacts 138 for contacting the lands on the major surface 114 of the land grid array package 100.

Although the lands on the land grid array package 100 are closely spaced and therefore provide for an economical package with short conductor links, there are major problems associated with the prior art land grid array package 100 and socket 130 designs. Namely, the lands of the land grid array device 100 carry both power as well as signal level currents across the various lands of the land grid array device 100. As a result, the amount of power that can be used to run the electronics within the die 120 is limited. In addition, the land grid array package 100 is brought straight down into contact with the socket 130. The problem is that the individual contacts 138 do not have an adequate wiping distance in order to assure that there is good electrical contact made between the individual lands and the individual contacts 138.

Figure 2:
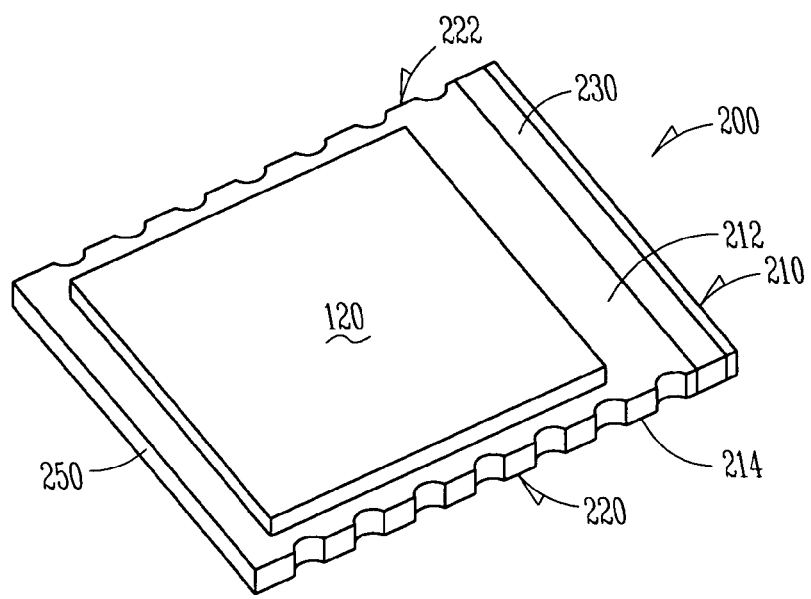
FIG. 2 illustrates a perspective view of a land grid array package of this invention.
Figure 3:
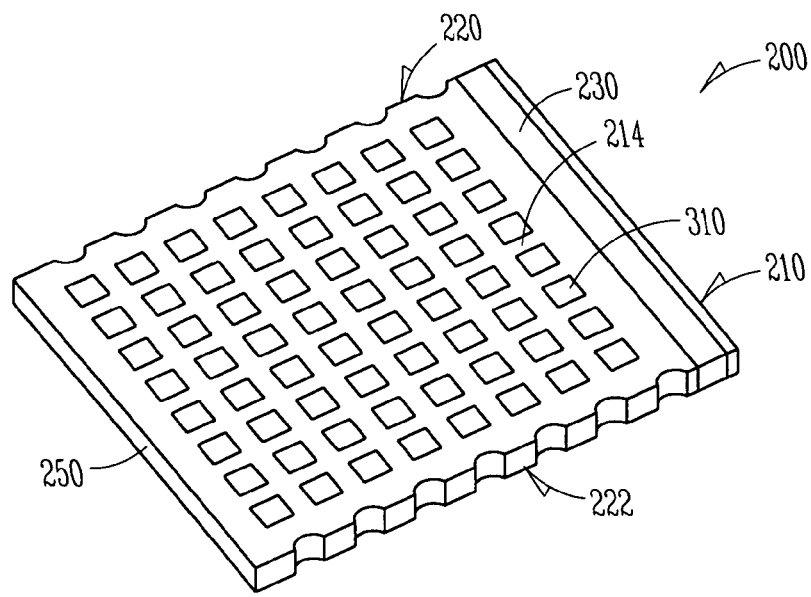
FIG. 3 illustrates a bottom perspective view of the land grid array package of this invention.

FIGS. 2 and 3 illustrate respective perspective views of a land grid array package 200 of this invention. FIG. 2 shows a top perspective view of the land grid array package 200, and FIG. 3 illustrates a bottom perspective view of the land grid array package 200 of this invention. The land grid array package includes a substrate 210 which has a first major surface 212 and a second major surface 214. A die 120 is attached to the first major surface 212 of the substrate 210. The die 120 includes electronics, such as a microprocessor or other semiconductor device. The die 120 includes inputs and outputs which are attached to connectors on the first major surface 212 of the substrate 210. The substrate 210 includes a first scalloped edge 220 and a second scalloped edge 222. The scalloped edges 220, 222 form a postage-stamp style edge. The substrate 210 also includes a solid end 230. The solid end 230 and the scalloped edges 220, 222 are capable of carrying high levels of current associated with powering the die 120 attached to the substrate 210.

FIG. 3 illustrates a bottom perspective view of the land grid array package 200. FIG. 3 shows the first scalloped edge 220 and the second scalloped edge 222, as well as the solid elongated end 230. The second major surface 214 of the land grid array package 200 is shown in FIG. 3. The second major surface 214 includes an array of lands 310 which are used to contact separate contacts in a corresponding socket. The corresponding socket will be discussed with respect to FIG. 4. The package 200 is advantageous in that it separates the function of carrying current for inputs/outputs from the function of carrying current to power the die 120. In other words, the chip is powered by delivering higher current levels to the solid end 230 of the land grid array package 200. The scalloped edges 220, 222 may also be used to carry higher levels of current to power the electronics within the die 120. Thus, there is no need to deliver power via individual lands 310 on the second major surface 214 of the die 200. In other words, the power carrying function is removed from the individual lands 310 on the second major surface 214 of the substrate 210. The lands 310 therefore carry input/output signals between the die 120 and the contacts on the socket.

Figure 4:
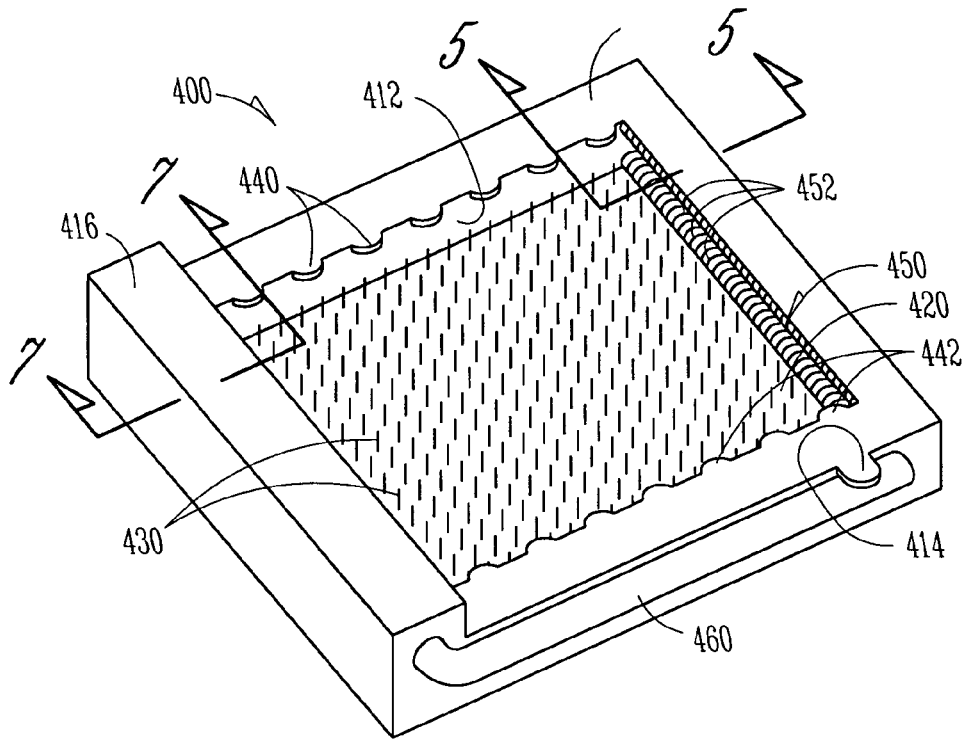
FIG. 4 illustrates a perspective view of a socket for the land grid array package of this invention.

FIG. 4 illustrates a perspective view of a socket 400 for the land grid array package of this invention. The land grid array socket 400 includes a base 410 having an opening 412. The socket includes a major surface 420 located at the bottom of the opening 412 in the base 410. The major surface 420 includes an array of individual contact elements 430 for contacting the individual lands 310 on the land grid array package 200 (shown in FIGS. 2 and 3). The substrate includes a first overhang 440 along one edge of the opening 412 and a second overhang 442 along a second edge of the opening 412. The overhangs 440 and 442 may be single or, as shown in FIG. 4, the overhangs are a series or plurality of overhangs which occur upon their respective edges of the opening 412. The opening also includes a slot 450 along another edge of the opening 412. The slot 450 includes electrical contacts 452. The individual electrical contacts 452 are substantial enough to allow a selected level of power to be delivered to the solid end 210 of the land grid array package 200 (shown in FIGS. 2 and 3). The socket 400 also includes a lever arm 460. The lever arm 460 is capable of a number of positions and moves a cam within an end 416 of the socket 400. The base 410 includes a stop 414 for limiting the position of the lever arm 460. The cam will be discussed with respect to FIG. 7.

Figure 5:
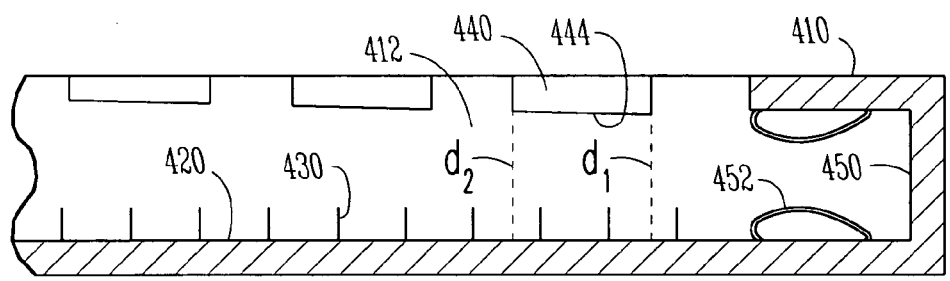
FIG. 5 illustrates a scalloped edge of the socket along line 5-5 in FIG. 4 of this invention.

FIG. 5 illustrates a scalloped edge 412 of the land grid array socket 400 (shown in FIG. 4) of this invention. A cross-sectional view shows the edge of the opening 412 that includes the overhang 440. The cross-sectional view also shows the major surface 420 and the individual contacts 430 positioned or attached to the major surface 420. Also shown in the cross-sectional view is the slot 450 and the individual contacts 452 that are used to deliver power to the solid edge 230 of the land grid array package 200 (shown in FIGS. 2 and 3). It should be noted that the overhangs 440 include an inclined or ramped surface 444. The ramp surface 444 is sloped. The slope of the surface 444 results in varying distances between the surface 444 and the major surface 420 of the socket 400. In essence, each of the overhangs 440 includes a first portion where the surface 444 is located at a first distance away from the major surface 420, as well as a second portion wherein the surface 444 is located at a second distance from the major surface 420 of the socket 400. The first distance is denoted by the reference numeral $d_1$ in FIG. 5, and the second distance is referenced by the letter $d_2$ in FIG. 5. The distance $d_1$ is shorter than the distance $d_2$ due to the slope.

Figure 6:
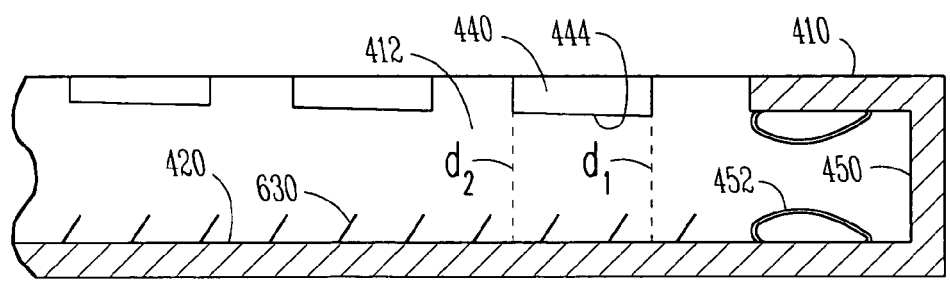
FIG. 6 shows another embodiment of this invention wherein the spring contacts are angled with respect to the major surface of the socket.

FIG. 6 shows another embodiment of the invention wherein the spring contact 630 makes an angle less than 90 degrees with respect to the major surface 420 of the opening 412.

Figure 7:
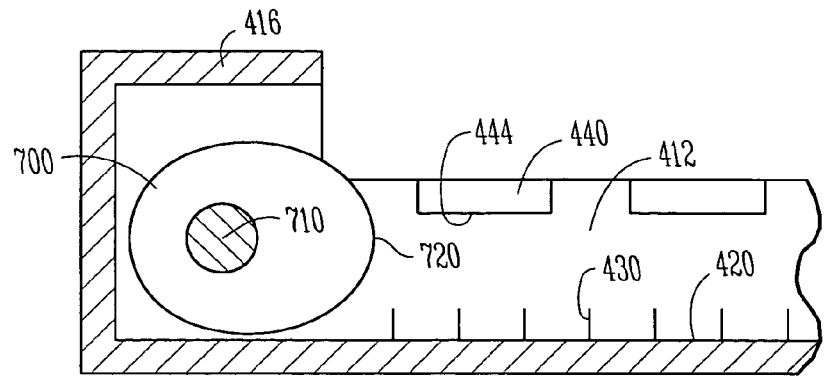
FIG. 7 illustrates a cut away view of the cam of this invention along line 7-7 in FIG. 4.

FIG. 7 shows a cutaway view of a cam 700 of this invention along line 7-7 in FIG. 4. The cam 700 includes an axis 710 and a cam having a lobe 720 thereon. The lever arm 460 (shown in FIG. 4) is attached to the axis 710 of the cam 700. By moving the lever arm 460 the cam 700 is moved from a position where the lobe 720 is directed away from the end slot 450 to a position where the lobe 720 is positioned toward the end slot 450 on the socket 400.

The operation of the socket 400 and package 200 will now be discussed with respect to FIGS. 2-4, and 7. In operation, the land grid array package 200 is placed into the opening 412 of the socket 400. The overhangs 440, 442 are spaced such that they fit between the scalloped indents 220, 222 of the land grid array package 200. In other words, the scalloped edges 220, 222 of the land grid array package fit past the overhangs 440, 442 along the edges of the opening 412. Initially, the land grid array package 200 is placed in the opening 412 of the socket 400. In its initial position, the solid end 230 of the land grid array package 200 is not engaged with the slot 450 of the socket 400, and the lobe 720 of the cam 700 is positioned away from the slot 450. The next step is to move the lever arm 460 to turn the lobe 720 toward the slot 450. The lobe 720 acts on the edge 250 of the land grid array package 200 and forces the solid end 230 into the slot 450 of the socket 400. Moving the package 200 into the slot 450 also causes the scalloped edges 220, 222 to be captured by the overhangs 440, 442. The slanted or sloped edge of the overhang 440, 442 places a peripheral force above the edge of the package 200 as the land grid array package 200 is forced into the slot 450. In other words, the cam 700 forces the land grid array package 200 into the slot and forces the land grid array package 200 underneath the overhang 440, 442 of the socket 400. This results in the solid end 230 being forced into the slot 450 as well as the overhangs 440, 442 placing an additional force on the scalloped edges 220, 222 of the land grid array package 200. The overhangs 440, 442 therefore produce an evenly distributed force about the periphery of the package 200 and also produce a good contact for transmission of current levels associated with powering the electronics of the die 120. By moving the land grid array package 200 across the contacts 430, 630 the wiping distance is lengthened while an increasing amount of force is placed onto the die. Good, reliable electrical contact between the package 200 and the socket 400 is assured since the wiping distance is increased. Good electrical contact between the package 200 and the socket 400 is also assured since the force between the package 200 and the socket 400 is also increased. Increasing force between the package 200 and socket 400 assures that any oxide layer on the land 310 is penetrated to produce a good electrical contact.

The structure and method of this invention has many advantages. Among the advantages is that the structure meets a growing demand for high loads and evenly distributed loads on a die package. The structure is capable of carrying high loads and distributing these loads substantially evenly over the die package since the structure uses a separate slot, and separates the current carrying function from the lands of the land grid array package. Thus, the land grid array packaging method and apparatus described allows for higher current carrying portions, mainly for delivering power to the die, in the simple, high contact density, low inductance land grid array package. The problem of a short wiping distance is eliminated because the wiping distance is lengthened when the die package is moved vertically across the socket and into the slot at one end of the base of the socket. The longer wiping distance assures a reliable, good electrical contact between the contacts in the socket and the individual lands of the die package.

Figure 8:
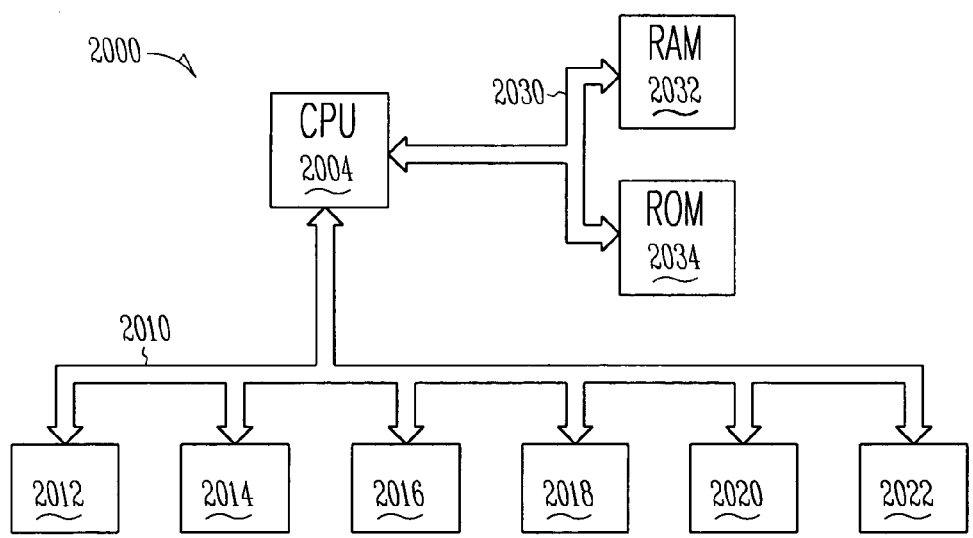
FIG. 8 illustrates a schematic view of computer system which includes this invention.

FIG. 8 is a schematic view of a computer system. Advantageously, the invention is well-suited for use in a computer system 2000. The computer system 2000 may also be called an electronic system or an information handling system, and includes a central processing unit, a memory and a system bus. The information handling system includes a central processing unit 2004, a random access memory 2032, and a system bus 2030 for communicatively coupling the central processing unit 2004 and the random access memory 2032. The information handling system 2000 includes a disc drive device which includes the ramp described above. The information handling system 2000 may also include an input/output bus 2010 and several peripheral devices, such as 2012, 2014, 2016, 2018, 2020, and 2022 may be attached to the input output bus 2010. Peripheral devices may include hard disc drives, magneto optical drives, floppy disc drives, monitors, keyboards and other such peripherals. Any type of disc drive may use the method for loading or unloading the slider onto the disc surface as described above.

In conclusion, a package for a semiconductor device includes a substrate having a first major surface, a second major surface, a first scalloped edge and a second scalloped edge. The package also has a solid end adapted for insertion into a slot. The first scalloped edge, the second scalloped edge and the solid end carry currents greater than the current needed for an input/output signal. A plurality of electrical contacts are attached to one of the first major surface and the second major surface. A die is attached to the other of the first major surface and the second major surface of the substrate. The plurality of electrical contacts carry input/output signals. In some embodiments, the first scalloped edge, the second scalloped edge and the solid end include gold plating to enhance the conductivity of current. The plurality of electrical contacts are lands. The die attached to the substrate is a microprocessor.

A socket for a semiconductor device for use with the package includes a base having an opening therein adapted to receive a semiconductor device. The base further includes a major planar surface located within the opening, and a plurality of electrical contacts attached to the major planar surface. A slot is located at one end of the opening in the base. The slot is provided with a plurality of conductors for carrying currents. The current carried by the conductors in the slot is greater than the current needed for input/output signals. A first edge of the opening includes a first overhang positioned over the major planar surface within the opening, and a second edge of the opening includes a second overhang positioned over the major planar surface within the opening. The first overhang and second overhang are sloped with respect to the major planar surface. In some embodiments, one or both of the first edge and second edge include a plurality of spaced overhangs. The space between the plurality of spaced overhangs is sufficient to allow a package to pass the overhangs for insertion into the opening in the base. In some embodiments, the plurality of electrical contacts attached to the major planar surface are angled with respect to the major planar surface. In other embodiments, the plurality of electrical contacts are attached to the major planar surface at a substantially perpendicular angle with respect to the major planar surface. The plurality of electrical contacts may have a spring therein. A cam is positioned on an edge of the socket. The cam has a cam surface that rotates about a lever, wherein the distance between the socket and the cam surface is longer when the lever is in a first position, than when the cam surface is in a second position. In some embodiments, a stop for stopping the travel of the lever is provided on the base of the socket. The plurality of spaced overhangs on the first edge are also sloped so that the distance between the major planar surface of the opening and a particular overhang is smaller at the portion of the particular overhang nearer to the slot at one end of the opening in the base.

A system for providing electrical contacts between a die and an electrical device includes a die and a package. The package includes a first major surface, a second major surface, a first scalloped edge, a second scalloped edge and a solid end adapted for insertion into a slot. The solid end carries current greater than the current needed for an input/output signal. The package also includes a plurality of electrical contacts attached to one of the first major surface and the second major surface, and a die attached to the other of the first major surface and the second major surface of the substrate. The socket includes a base having an opening therein adapted to receive the package. The base also includes a major planar surface located within the opening and a plurality of electrical contacts attached to the major planar surface. A slot is located at one end of the opening in the base. The slot is provided with a plurality of conductors for carrying currents greater than the current needed for an input/output signal. A first edge of the opening includes a plurality of spaced overhangs positioned over the major planar surface within the opening, and a second edge of the opening including a plurality of spaced overhangs positioned over the major planar surface within the opening. The overhangs are spaced to correspond to the first scalloped edge and the second scalloped edge of the package. The first overhang and the second overhang are both sloped with respect to the major planar surface. The overhangs are sloped so that at least one of the overhangs results in the distance between a portion nearer the slot being less than a portion of the overhang more distal from the slot. The slope of the first overhang and second overhang forces the package toward the major planar surface of the opening when the package is moved toward the slot at one end of the opening. In some embodiments, the first overhang and the second overhang also carry currents larger than the current needed for an input/output signal. The plurality of electrical contacts attached to one of the first major surface and the second major surface of the package carry input/output signals. In some embodiments, the plurality of electrical contacts attached to one of the major surfaces are lands arranged in an array. A cam is positioned on an edge of the socket distant from the slot. The cam has a cam surface that rotates about a lever, wherein the distance between the socket and the cam surface is longer when the lever is in a first position than when the cam surface is in a second position. When the cam is in a first position, the opening in the base of the socket receives the package. When the cam is in a second position, the package is moved into electrical contact with the slot and the plurality of contacts on the major planar surface of the opening.

A method of connecting a land grid array package to a corresponding socket includes placing the package into the opening in the base of the socket, and sliding the package over the major planar surface into engagement with a slot in the socket. The method also includes sending input/output signals through the land contacts of the land grid array package, the input/output signals having a first current level associated therewith, and sending currents larger than the input/output signals through the slot and portion of the package mating with the slot. The package further includes a first scalloped edge and a second scalloped edge. The socket includes corresponding overhangs which allow the package to pass by the overhangs when inserted into the opening in the socket, but which are sandwiched between a major surface of the opening and the overhangs as the package slides toward a slot in the socket. The method includes forcing the package into engagement with the major planar surface of the opening as the package slides into engagement with the slot. In some embodiments, the first scalloped edge and the second scalloped edge of the package 200 and the corresponding overhangs of the socket 400 are used to carry currents greater than those associated with input/output signals from the contacts of the package.

The structure and method of this invention has many advantages. Among the advantages is that the structure meets a growing demand for high loads and evenly distributed loads on a die package. The structure is capable of carrying high loads and distributing these loads substantially evenly over the die package since the structure uses a separate slot and separates the current carrying function from the lands of the land grid array package. Thus, the land grid array packaging method and apparatus described allows for higher current carrying portions, mainly for delivering power to the die, in the simple, high contact density, low inductance land grid array package. The problem of a short wiping distance is eliminated because the wiping distance is lengthened when the die package is moved vertically across the socket and into the slot at one end of the base of the socket. The longer wiping distance assures a reliable, good electrical contact between the contacts in the socket and the individual lands of the die package.

The foregoing description of the specific embodiments reveals the general nature of the invention sufficiently that others can, by applying current knowledge, readily modify and/or adapt it for various applications without departing from the generic concept, and therefore such adaptations and modifications are intended to be comprehended within the meaning and range of equivalents of the disclosed embodiments.

It is to be understood that the phraseology or terminology employed herein is for the purpose of description and not of limitation. Accordingly, the invention is intended to embrace all such alternatives, modifications, equivalents and variations as fall within the spirit and broad scope of the appended claims.

What is claimed is:

1. A method of connecting a land grid array package including an array of land contacts to a corresponding socket comprising:
    placing the package into an opening in the base of the socket;
    sliding the package over a major planar surface into engagement with a slot in the socket;
    sending input/output signals through the land contacts of the land grid array package; and
    sending power to the land grid array package through the slot and portion of the package mating with the slot.

2. The method of claim 1, wherein the package further comprises a first scalloped edge and a second scalloped edge, and the socket includes at least one set of overhangs having a shape to allow the package to pass by the overhangs when inserted, the at least one overhang attached to an edge of the opening and projecting over the major planar surface of the opening, the method further comprising forcing the package into engagement with the major planar surface of the opening as the package slides into engagement with the slot, wherein the package is sandwiched between the at least one overhang and the major surface of the opening when engaged with the slot.

3. The method of claim 2, wherein the first scalloped edge and the second scalloped edge of the package, and the corresponding at least one overhang of the socket, are used to carry power to the package.

4. The method of connecting a land grid array package of claim 1 further comprising connecting a die to the package.

5. The method of connecting a land grid array package of claim 1 further comprising connecting a microprocessor to the package.

* * * * *